United States Patent
Luo et al.

(10) Patent No.: US 9,246,480 B2
(45) Date of Patent: Jan. 26, 2016

(54) METHOD FOR PERFORMING PHASE SHIFT CONTROL IN AN ELECTRONIC DEVICE, AND ASSOCIATED APPARATUS

(71) Applicant: MEDIATEK INC., Hsin-Chu (TW)

(72) Inventors: Yan-Bin Luo, Taipei (TW); Bo-Jiun Chen, New Taipei (TW); Ke-Chung Wu, New Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 46 days.

(21) Appl. No.: 14/294,130

(22) Filed: Jun. 2, 2014

(65) Prior Publication Data

US 2015/0349763 A1   Dec. 3, 2015

(51) Int. Cl.
*H03H 11/16* (2006.01)
*H03K 5/13* (2014.01)

(52) U.S. Cl.
CPC ..................................... *H03K 5/131* (2013.01)

(58) Field of Classification Search
None
See application file for complete search history.

(56) References Cited

U.S. PATENT DOCUMENTS 6,617,936 B2    9/2003  Dally
7,760,833 B1 *  7/2010  Brunner ..................... 375/354

* cited by examiner

Primary Examiner — Cassandra Cox
(74) Attorney, Agent, or Firm — Winston Hsu; Scott Margo

(57) ABSTRACT

A method for performing phase shift control in an electronic device and an associated apparatus are provided, where the method includes: obtaining a set of clock signals corresponding to a set of phases, wherein any two phases of the set of phases are different from each other; and controlling a phase shift of an output signal of an oscillator by selectively mixing the set of clock signals into the oscillator according to a set of digital weighting control signals, wherein the phase shift corresponds to the set of digital weighting control signals, and the set of digital weighting control signals carries a set of digital weightings for selectively mixing the set of clock signals. More particularly, the method may include: selectively mixing the set of clock signals into a specific stage of a plurality of stages of the oscillator according to the set of digital weighting control signals.

21 Claims, 10 Drawing Sheets

METHOD FOR PERFORMING PHASE SHIFT CONTROL IN AN ELECTRONIC DEVICE, AND ASSOCIATED APPARATUS

BACKGROUND

The present invention relates to maintaining linearity of the hardware circuitry for a wide frequency range, and more particularly, to a method for performing phase shift control in an electronic device, and an associated apparatus.

According to the related art, a conventional phase interpolator can be utilized for performing phase interpolation to generate an interpolation signal having a resultant phase between two given phases. However, some problems may occur. For example, the operations of the conventional phase interpolator are typically limited due to the RC slew rate, and therefore, the conventional phase interpolator cannot be utilized to operate in a wide frequency range, and the conventional phase interpolator may suffer from linearity degradation, such as Differential Nonlinearity (DNL) and Integral Nonlinearity (INL). Examples of the wide frequency range mentioned above may include, but not limited to, the frequency range from 270 MHz to 6 GHz for some High Definition Multimedia Interface (HDMI) applications, the frequency range from 2.5 GHz to 16 GHz for some Peripheral Component Interconnect Express (PCI Express, PCIE or PCIe) applications, the frequency range from 1.5 GHz to 6 GHz for some Serial Advanced Technology Attachment (ATA, SATA) applications, and the frequency range from 1.25 G to 25 GHz for some Ethernet applications. Thus, a novel method is required for guaranteeing the capability of phase control in a wide frequency range such as that mentioned above, without introducing any side effects.

SUMMARY

It is an objective of the claimed invention to provide a method for performing phase shift control in an electronic device, and an associated apparatus, in order to solve the above-mentioned problems.

It is another objective of the claimed invention to provide a method for performing phase shift control in an electronic device, and an associated apparatus, in order to guarantee the capability of phase control in a wide frequency range without introducing any side effects.

According to at least one preferred embodiment, a method for performing phase shift control in an electronic device is provided, where the method comprises the steps of: obtaining a set of clock signals corresponding to a set of phases, wherein any two phases of the set of phases are different from each other; and controlling a phase shift of an output signal of an oscillator by selectively mixing the set of clock signals into the oscillator according to a set of digital weighting control signals, wherein the phase shift corresponds to the set of digital weighting control signals, and the set of digital weighting control signals carries a set of digital weightings for selectively mixing the set of clock signals. More particularly, the oscillator may comprise a plurality of stages, and the step of controlling the phase shift of the output signal of the oscillator by selectively mixing the set of clock signals into the oscillator according to the set of digital weighting control signals may further comprise: controlling the phase shift of the output signal of the oscillator by selectively mixing the set of clock signals into a specific stage of the plurality of stages according to the set of digital weighting control signals.

According to at least one preferred embodiment, an apparatus for performing phase shift control in an electronic device is provided, where the apparatus comprises at least one portion of the electronic device. The apparatus comprises an oscillator, and further comprises at least one mixing circuit that is electrically connected to the oscillator. The oscillator is arranged to generate an output signal. In addition, the aforementioned at least one mixing circuit comprises a set of clock receiving terminals that is arranged to obtain a set of clock signals corresponding to a set of phases, wherein any two phases of the set of phases are different from each other. Additionally, the aforementioned at least one mixing circuit is arranged to perform phase shift control on the output signal of the oscillator. For example, the aforementioned at least one mixing circuit may control a phase shift of the output signal of the oscillator by selectively mixing the set of clock signals into the oscillator according to a set of digital weighting control signals, wherein the phase shift corresponds to the set of digital weighting control signals, and the set of digital weighting control signals carries a set of digital weightings for selectively mixing the set of clock signals. More particularly, the oscillator may comprise a plurality of stages, and the aforementioned at least one mixing circuit may control the phase shift of the output signal of the oscillator by selectively mixing the set of clock signals into a specific stage of the plurality of stages according to the set of digital weighting control signals.

It is an advantage of the present invention that the present invention method and the associated apparatus can guarantee the capability of phase control in a wide frequency range, such as any of those for the aforementioned High Definition Multimedia Interface (HDMI) applications, the aforementioned Peripheral Component Interconnect Express (PCI Express, PCIE or PCIe) applications, the aforementioned Serial Advanced Technology Attachment (ATA, SATA) applications, and the aforementioned Ethernet applications, without introducing any side effects. In addition, the present invention method and the associated apparatus can prevent the related art problems (e.g. the problem of RC slew rate, the problem of Differential Nonlinearity (DNL), and the problem of Integral Nonlinearity (INL)).

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
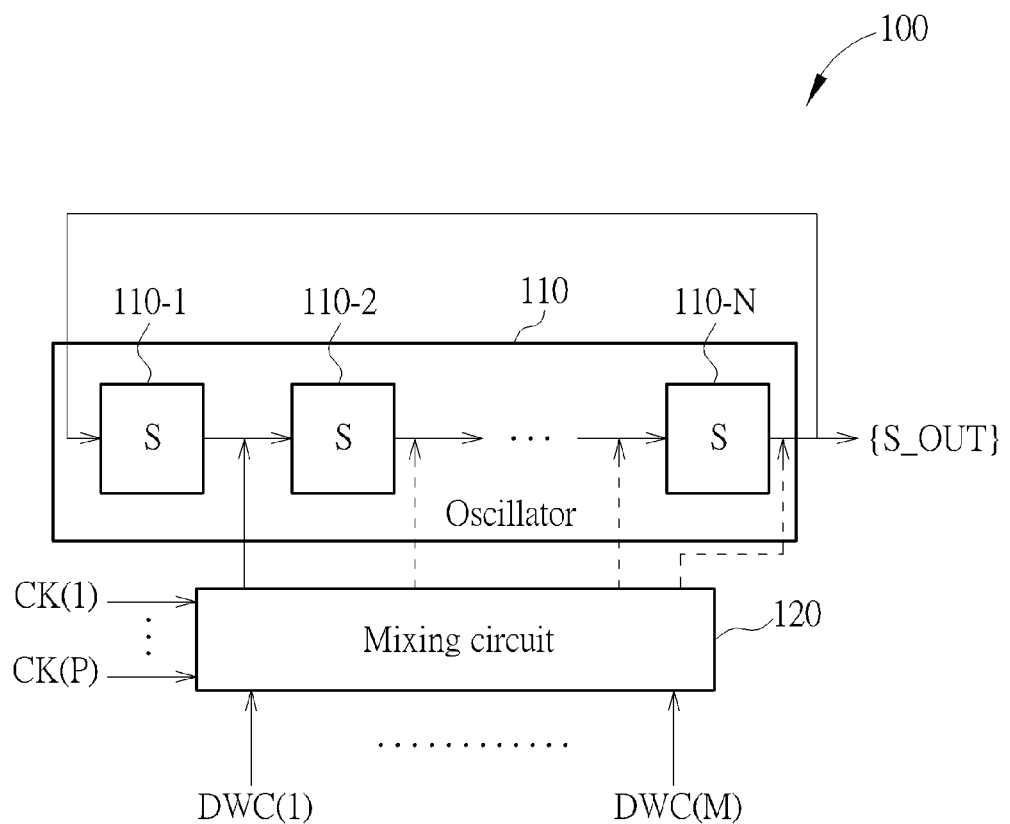
FIG. 1 is a diagram of an apparatus for performing phase shift control in an electronic device according to a first embodiment of the present invention.

Please refer to FIG. 1, which illustrates a diagram of an apparatus 100 for performing phase shift control in an electronic device according to a first embodiment of the present invention, where the apparatus 100 may comprise at least one portion (e.g. a portion or all) of the electronic device. For example, the apparatus 100 may comprise a portion of the electronic device mentioned above, and more particularly, can be at least one hardware circuit such as at least one integrated circuit (IC) within the electronic device and associated circuits thereof. In another example, the apparatus 100 can be the whole of the electronic device mentioned above. In another example, the apparatus 100 may comprise a system comprising the electronic device mentioned above (e.g. an audio/video system comprising the electronic device). Examples of the electronic device may include, but not limited to, a mobile phone (e.g. a multifunctional mobile phone), a personal digital assistant (PDA), and a personal computer such as a laptop computer.

As shown in FIG. 1, the apparatus 100 may comprise an oscillator 110, and further comprises at least one mixing circuit (e.g. one or more mixing circuits), which can be collectively referred to as the mixing circuit 120, where the aforementioned at least one mixing circuit (e.g. one or more mixing circuits) such as the mixing circuit 120 is electrically connected to the oscillator 110. The oscillator 110 is arranged to generate at least one output signal (e.g. one or more output signals), such as an output signal S_OUT. For example, the output signal S_OUT may represent a differential output signal in a set of differential output signals S_OUT+ and S_OUT− of a differential amplifier positioned within the oscillator 110 (e.g. one of the differential output signals S_OUT+ and S_OUT−). This is for illustrative purposes only, and is not meant to be a limitation of the present invention. In another example, the output signal S_OUT may represent a single-end amplifier output signal of a single-end amplifier positioned within the oscillator 110. For covering any of the two examples (e.g. the differential architecture or the single-end architecture), the apparatus 100 shown in FIG. 1 is illustrated with the output signal set { S_OUT}, which may represent the aforementioned differential output signal in the set of differential output signals S_OUT+ and S_OUT− of the aforementioned differential amplifier positioned within the oscillator 110 or represent the aforementioned single-end amplifier output signal of the aforementioned single-end amplifier positioned within the oscillator 110. Thus, the number of output signals within the output signal set {S_OUT} shown in FIG. 1 may be greater than or equal to one, depending on which example of the two examples (e.g. the differential architecture or the single-end architecture) is applied to the apparatus 100 shown in FIG. 1. Please note that, no matter whether the output signal S_OUT represents the aforementioned differential output signal in the set of differential output signals S_OUT+ and S_OUT− of the aforementioned differential amplifier positioned within the oscillator 110 or represents the aforementioned single-end amplifier output signal of the aforementioned single-end amplifier positioned within the oscillator 110, the operations of the apparatus 100 shown in FIG. 1 will not be hindered.

In addition, the aforementioned at least one mixing circuit such as the mixing circuit 120 comprises a set of clock receiving terminals that is arranged to obtain a set of clock signals $\{CK(1), CK(2), \ldots, CK(P)\}$ corresponding to a set of phases, where the notation "P" may represent a positive integer that is greater than one. Typically, any two phases of the set of phases mentioned above can be different from each other. Additionally, the aforementioned at least one mixing circuit such as the mixing circuit 120 is arranged to perform phase shift control on the output signal S_OUT of the oscillator 110. For example, the aforementioned at least one mixing circuit such as the mixing circuit 120 may control a phase shift of the output signal S_OUT of the oscillator 110 by selectively mixing the set of clock signals $\{CK(1), CK(2), \ldots, CK(P)\}$ into the oscillator 110 according to a set of digital weighting control signals $\{DWC(1), DWC(2), \ldots, DWC(M)\}$, where the notation "M" may represent a positive integer that is greater than one. As a result of utilizing the aforementioned at least one mixing circuit such as the mixing circuit 120 within the architecture shown in FIG. 1, the phase shift of the output signal S_OUT of the oscillator 110 corresponds to the set of digital weighting control signals $\{DWC(1), DWC(2), \ldots, DWC(M)\}$.

According to this embodiment, the oscillator 110 may comprise a plurality of stages 110-1, 110-2, . . . , and 110-N (respectively labeled "S" in FIG. 1, for brevity), where the notation "N" may represent a positive integer that is greater than one. More particularly, the set of digital weighting control signals $\{DWC(1), DWC(2), \ldots, DWC(M)\}$ may carry a set of digital weightings for selectively mixing the set of clock signals $\{CK(1), CK(2), \ldots, CK(P)\}$. In addition, the aforementioned at least one mixing circuit such as the mixing circuit 120 may control the phase shift of the output signal S_OUT of the oscillator 110 by selectively mixing the set of clock signals $\{CK(1), CK(2), \ldots, CK(P)\}$ into a specific stage 110-$n$ of the plurality of stages 110-1, 110-2, . . . , and 110-N according to the set of digital weighting control signals $\{DWC(1), DWC(2), \ldots, DWC(M)\}$, where the index n can be a positive integer that falls within the range of the interval [1, N]. This is for illustrative purposes only, and is not meant to be a limitation of the present invention. According to some variations of this embodiment, the number of connections for selectively mixing the set of clock signals {DWC(1), DWC (2), ..., DWC(M)} into the oscillator 110 may be varied. For example, the aforementioned at least one mixing circuit such as the mixing circuit 120 may selectively mix the set of clock signals {DWC(1), DWC(2), ..., DWC(M)} into multiple stages {110-*n*} of the plurality of stages 110-1, 110-2, ..., and 110-N of the oscillator 110, based on various kinds of configurations.

For better comprehension, in the architecture shown in FIG. 1, the connection relationships between the oscillator 110 and the aforementioned at least one mixing circuit such as the mixing circuit 120 are illustrated to be a direct connection that electrically connects the mixing circuit 120 to the output of the stage 110-1 of the oscillator 110, for example. This is for illustrative purposes only, and is not meant to be a limitation of the present invention. According to some variations of this embodiment, the connection relationships between the oscillator 110 and the aforementioned at least one mixing circuit such as the mixing circuit 120 may be varied. For example, the electric connection for selectively mixing the set of clock signals {DWC(1), DWC(2), ..., DWC(M)} into the specific stage 110-*n* mentioned above can be a direct connection that electrically connects the mixing circuit 120 to the output of the specific stage 110-*n* such as any stage within the plurality of stages 110-1, 110-2, ..., and 110-N of the oscillator 110.

In practice, each stage of the plurality of stages 110-1, 110-2, ..., and 110-N may comprise an amplifier. For example, each stage of the plurality of stages 110-1, 110-2, ..., and 110-N may comprise a differential amplifier. This is for illustrative purposes only, and is not meant to be a limitation of the present invention. In another example, each stage of the plurality of stages 110-1, 110-2, ..., and 110-N may comprise a single-end amplifier. In another example, each stage of the plurality of stages 110-1, 110-2, ..., and 110-N may comprise a current mode amplifier. In another example, each stage of the plurality of stages 110-1, 110-2, ..., and 110-N may comprise a voltage mode amplifier.

Based on the architecture shown in FIG. 1, the electronic device that is implemented according to the apparatus 100 can be equipped with the capability of phase control in a wide frequency range, such as any of those for the aforementioned High Definition Multimedia Interface (HDMI) applications, the aforementioned Peripheral Component Interconnect Express (PCI Express, PCIE or PCIe) applications, the aforementioned Serial Advanced Technology Attachment (ATA, SATA) applications, and the aforementioned Ethernet applications, without introducing any side effects. In addition, the related art problems mentioned above, such as the problem of RC slew rate, the problem of Differential Nonlinearity (DNL), and the problem of Integral Nonlinearity (INL), can be prevented.

Figure 2:
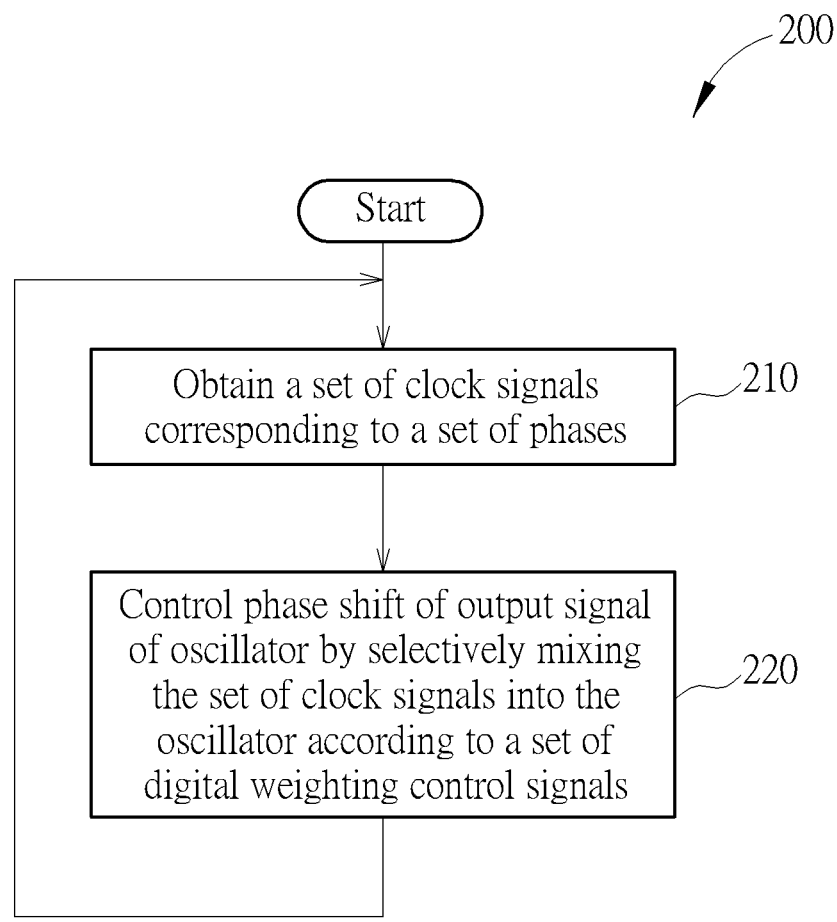
FIG. 2 illustrates a flowchart of a method for performing phase shift control in an electronic device according to an embodiment of the present invention.

FIG. 2 illustrates a flowchart of a method 200 for performing phase shift control in an electronic device according to an embodiment of the present invention. The method 200 shown in FIG. 2 can be applied to the apparatus 100 shown in FIG. 1, and can be applied to the aforementioned at least one mixing circuit thereof, such as the mixing circuit 120. The method 200 can be described as follows.

In Step 210, the aforementioned at least one mixing circuit such as the mixing circuit 120 utilizes a set of clock receiving terminals to obtain a set of clock signals corresponding to a set of phases, such as the set of clock signals {CK(1), CK(2), ..., CK(P)} corresponding to the set of phases mentioned in the embodiment shown in FIG. 1, where any two phases of the set of phases are different from each other.

In Step 220, while the oscillator 110 is generating the output signal S_OUT, the aforementioned at least one mixing circuit such as the mixing circuit 120 controls the phase shift of the output signal S_OUT of the oscillator 110 by selectively mixing the set of clock signals {CK(1), CK(2), ..., CK(P)} into the oscillator 110 according to a set of digital weighting control signals, such as the set of digital weighting control signals {DWC(1), DWC(2), ..., DWC(M)} carrying the set of digital weightings for selectively mixing the set of clock signals {CK(1), CK(2), ..., CK(P)}.

For example, the mixing circuit 120 may selectively mix the set of clock signals {CK(1), CK(2), ..., CK(P)} at a node in the oscillator 110 according to the set of digital weighting control signals {DWC(1), DWC(2), ..., DWC(M)}, to control (or adjust) the phase shift of the output signal S_OUT of the oscillator 110. This is for illustrative purposes only, and is not meant to be a limitation of the present invention. In another example, the mixing circuit 120 may selectively mix the set of clock signals {CK(1), CK(2), ..., CK(P)} at at least one node (e.g. one or more nodes) in the oscillator 110 according to the set of digital weighting control signals {DWC(1), DWC(2), ..., DWC(M)}, to control (or adjust) the phase shift of the output signal S_OUT of the oscillator 110.

Please note that the operation of Step 210 and the operation of Step 220 are illustrated in FIG. 2, respectively. This is for illustrative purposes only, and is not meant to be a limitation of the present invention. According to some variations of this embodiment, at least one portion (e.g. a portion or all) of the operation of Step 210 and at least one portion (e.g. a portion or all) of the operation of Step 220 can be performed at the same time.

According to this embodiment, the oscillator 110 comprises a plurality of stages such as the plurality of stages 110-1, 110-2, ..., and 110-N shown in FIG. 1. The aforementioned at least one mixing circuit such as the mixing circuit 120 controls the phase shift of the output signal S_OUT of the oscillator 110 by selectively mixing the set of clock signals {CK(1), CK(2), ..., CK(P)} into one of the plurality of stages 110-1, 110-2, ..., and 110-N, such as the specific stage 110-*n* mentioned above, according to the set of digital weighting control signals {DWC(1), DWC(2), ..., DWC(M)}. More particularly, the aforementioned at least one mixing circuit such as the mixing circuit 120 controls the phase shift of the output signal S_OUT of the oscillator 110 by injecting at least one portion (e.g. a portion or all) of the set of clock signals {CK(1), CK(2), ..., CK(P)} into the specific stage 110-*n* according to the set of digital weighting control signals {DWC(1), DWC(2), ..., DWC(M)}. For example, the signal count of the aforementioned at least one portion of the set of clock signals {CK(1), CK(2), ..., CK(P)} corresponds to the set of digital weightings carried by the set of digital weighting control signals {DWC(1), DWC(2), ..., DWC(M)}. This is for illustrative purposes only, and is not meant to be a limitation of the present invention.

According to some embodiments of the present invention, the aforementioned at least one mixing circuit such as the mixing circuit 120 may further comprise another set of clock receiving terminals, and the other set of clock receiving terminals is arranged to obtain another set of clock signals {CK(P+1), CK(P+2), ..., CK(P+P(1))} corresponding to another set of phases, where the notation "P(1)" may represent a positive integer that is greater than one, and any two phases of the other set of phases are different from each other. For example, in a situation where the aforementioned at least one mixing circuit comprises a plurality of mixing circuits (which can be referred to as the mixing circuits {120}), the set of clock receiving terminals can be input terminals of one of the plurality of mixing circuits, and the other set of clock receiving terminals can be input terminals of another one of the plurality of mixing circuits. In another example, in a situation where the aforementioned at least one mixing circuit comprises a single mixing circuit (which can be referred to as the mixing circuit 120), both of the set of clock receiving terminals and the other set of clock receiving terminals can be input terminals of the single mixing circuit mentioned above.

No matter whether the aforementioned at least one mixing circuit comprises the plurality of mixing circuits (e.g. the mixing circuits {120} mentioned above) or the single mixing circuit (e.g. the mixing circuit 120 mentioned in the above example), the aforementioned at least one mixing circuit may control the phase shift of the output signal S_OUT of the oscillator 110 by selectively mixing the set of clock signals {CK(1), CK(2), ..., CK(P)} into the specific stage 110-$n$ of the plurality of stages 110-1, 110-2, ..., and 110-N according to the set of digital weighting control signals and by selectively mixing the other set of clock signals {CK(P+1), CK(P+2), ..., CK(P+P(1))} into another stage 110-$n(1)$ of the plurality of stages 110-1, 110-2, ..., and 110-N according to another set of digital weighting control signals {DWC(M+1), DWC(M+2), ..., DWC(M+M(1))}, where the index n(1) can be a positive integer that falls within the range of the interval [1, N], with the index n(1) and the index n mentioned above being different from each other, and the notation "M(1)" may represent a positive integer that is greater than one.

More particularly, the aforementioned at least one mixing circuit controls the phase shift of the output signal S_OUT of the oscillator 110 by injecting at least one portion (e.g. a portion or all) of the set of clock signals {CK(1), CK(2), ..., CK(P)} into the specific stage 110-$n$ of the plurality of stages 110-1, 110-2, ..., and 110-N according to the set of digital weighting control signals {DWC(1), DWC(2), ..., DWC(M)} and by injecting at least one portion (e.g. a portion or all) of the other set of clock signals {CK(P+1), CK(P+2), ..., CK(P+P(1))} into the other stage of the plurality of stages according to the other set of digital weighting control signals {DWC(M+1), DWC(M+2), ..., DWC(M+M(1))}. For example, the signal count of the at least one portion of the set of clock signals {CK(1), CK(2), ..., CK(P)} corresponds to the set of digital weightings carried by the set of digital weighting control signals {DWC(1), DWC(2), ..., DWC(M)}, and the signal count of the at least one portion of the other set of clock signals {CK(P+1), CK(P+2), ..., CK(P+P(1))} corresponds to a set of digital weightings carried by the other set of digital weighting control signals {DWC(M+1), DWC(M+2), ..., DWC(M+M(1))}.

According to some embodiments of the present invention, the other set of clock signals {CK(P+1), CK(P+2), ..., CK(P+P(1))} can be equivalent to the set of clock signals {CK(1), CK(2), ..., CK(P)}. For example, the other set of digital weighting control signals {DWC(M+1), DWC(M+2), ..., DWC(M+M(1))} for controlling which portion of the other set of clock signals {CK(P+1), CK(P+2), ..., CK(P+P(1))} should be injected into the other stage 110-$n(1)$ (e.g. the aforementioned at least one portion of the other set of clock signals {CK(P+1), CK(P+2), ..., CK(P+P(1))}) can be different from the set of digital weighting control signals {DWC(1), DWC(2), ..., DWC(M)} for controlling which portion of the set of clock signals {CK(1), CK(2), ..., CK(P)} should be injected into the specific stage 110-$n$ (e.g. the aforementioned at least one portion of the set of clock signals {CK(1), CK(2), ..., CK(P)}). This is for illustrative purposes only, and is not meant to be a limitation of the present invention. In some examples, the other set of digital weighting control signals {DWC(M+1), DWC(M+2), ..., DWC(M+M(1))} for controlling which portion of the other set of clock signals {CK(P+1), CK(P+2), ..., CK(P+P(1))} should be injected into the other stage 110-$n(1)$ (e.g. the aforementioned at least one portion of the other set of clock signals {CK(P+1), CK(P+2), ..., CK(P+P(1))}) may be dependent on the set of digital weighting control signals {DWC(1), DWC(2), ..., DWC(M)} for controlling which portion of the set of clock signals {CK(1), CK(2), ..., CK(P)} should be injected into the specific stage 110-$n$ (e.g. the aforementioned at least one portion of the set of clock signals {CK(1), CK(2), ..., CK(P)}).

In some examples, at least one portion (e.g. a portion or all) of the other set of digital weighting control signals {DWC(M+1), DWC(M+2), ..., DWC(M+M(1))} for controlling which portion of the other set of clock signals {CK(P+1), CK(P+2), ..., CK(P+P(1))} should be injected into the other stage 110-$n(1)$ (e.g. the aforementioned at least one portion of the other set of clock signals {CK(P+1), CK(P+2), ..., CK(P+P(1))}) may be independent of the set of digital weighting control signals {DWC(1), DWC(2), ..., DWC(M)} for controlling which portion of the set of clock signals {CK(1), CK(2), ..., CK(P)} should be injected into the specific stage 110-$n$ (e.g. the aforementioned at least one portion of the set of clock signals {CK(1), CK(2), ..., CK(P)}).

In some examples, at least one portion (e.g. a portion or all) of the other set of digital weighting control signals {DWC(M+1), DWC(M+2), ..., DWC(M+M(1))} for controlling which portion of the other set of clock signals {CK(P+1), CK(P+2), ..., CK(P+P(1))} should be injected into the other stage 110-$n(1)$ (e.g. the aforementioned at least one portion of the other set of clock signals {CK(P+1), CK(P+2), ..., CK(P+P(1))}) may be dependent on the set of digital weighting control signals {DWC(1), DWC(2), ..., DWC(M)} for controlling which portion of the set of clock signals {CK(1), CK(2), ..., CK(P)} should be injected into the specific stage 110-$n$ (e.g. the aforementioned at least one portion of the set of clock signals {CK(1), CK(2), ..., CK(P)}).

Based on the architecture shown in FIG. 1 and the method thereof such as the method 200 shown in FIG. 2, the apparatus 100 can generate the output signal S_OUT of the oscillator 110 without performing any locking operation within any of the oscillator 110 and the aforementioned at least one mixing circuit such as the mixing circuit 120. More particularly, in any of the embodiment show in FIG. 2 and the other embodiments described above, the aforementioned at least one mixing circuit such as the mixing circuit 120 can control the phase shift of the output signal S_OUT of the oscillator 110 by injecting at least one portion (e.g. a portion or all) of the set of clock signals {CK(1), CK(2), ..., CK(P)} into the specific stage 110-$n$ according to the set of digital weighting control signals {DWC(1), DWC(2), ..., DWC(M)}, rather than by locking the output signal S_OUT onto any reference signal within the electronic device.

In practice, the apparatus 100 may further comprise a frequency calibration module (not shown in FIGS. 1-2), and the frequency calibration module is arranged to monitor an operation frequency of the oscillator 110 to control a slew rate of the electronic device. As the slew rate can be easily controlled by monitoring the operation frequency of the oscillator 110, the present invention method and the associated apparatus (e.g. the method 200 and the apparatus 100) can guarantee the capability of phase control in a wide frequency range, such as any of those for the aforementioned HDMI applications, the aforementioned PCIe applications, the aforementioned SATA applications, and the aforementioned Ethernet applications, without introducing any side effects. In addition, the present invention method and the associated apparatus (e.g. the method 200 and the apparatus 100) can prevent the related art problems mentioned above, such as the problem of RC slew rate, the problem of DNL, and the problem of INL.

Figure 3:
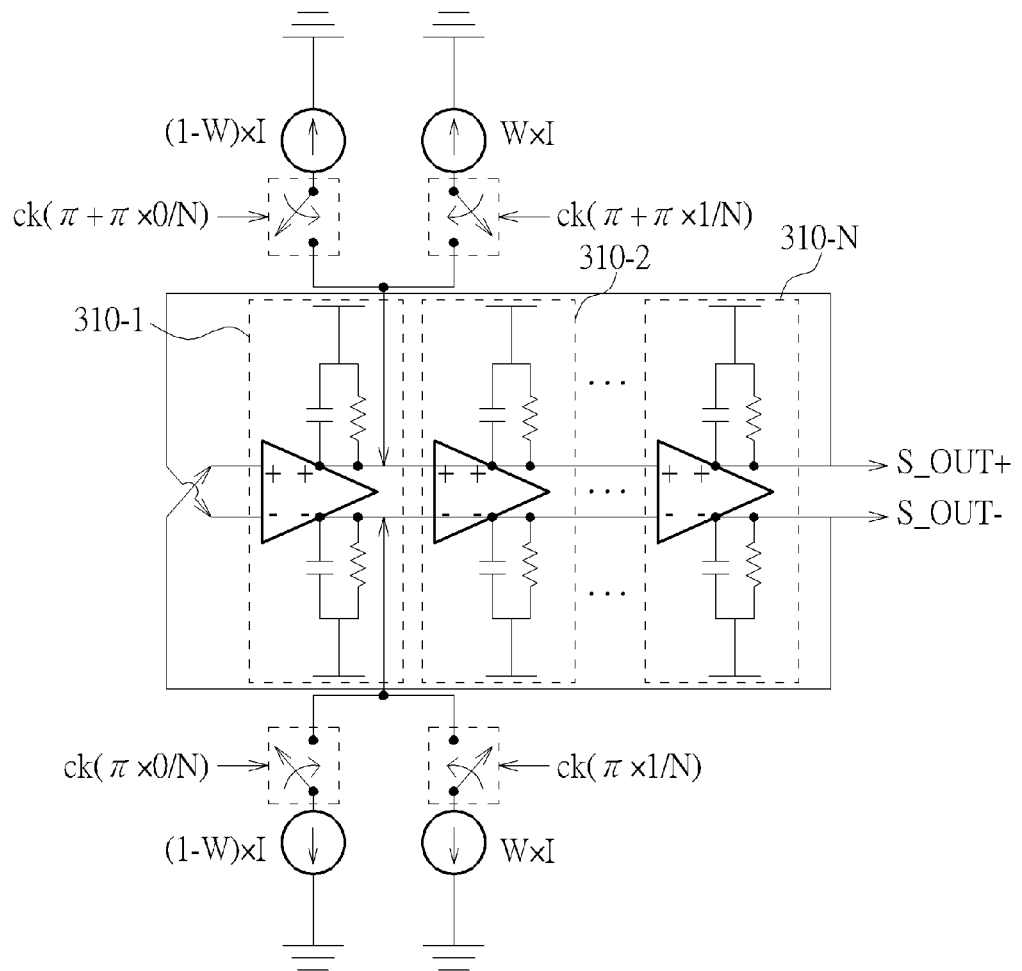
FIG. 3 illustrates a current mode control scheme involved with the method shown in FIG. 2 according to an embodiment of the present invention.

FIG. 3 illustrates a current mode control scheme involved with the method 200 shown in FIG. 2 according to an embodiment of the present invention, where the stages 310-1, 310-2, . . . , and 310-N can be taken as an example of the plurality of stages 110-1, 110-2, . . . , and 110-N shown in FIG. 1. In this embodiment, each stage of the plurality of stages 110-1, 110-2, . . . , and 110-N, such as any of the stages 310-1, 310-2, . . . , and 310-N shown in FIG. 3, may comprise a current mode amplifier. This is for illustrative purposes only, and is not meant to be a limitation of the present invention. According to some variations of this embodiment, each stage of the plurality of stages 110-1, 110-2, . . . , and 110-N may comprise a voltage mode amplifier.

As shown in FIG. 3, the aforementioned at least one mixing circuit such as the mixing circuit 120 may comprise a set of adjustable current sources respectively corresponding to the set of clock signals {CK(1), CK(2), . . . , CK(P)} mentioned above, such as the two current sources shown around the uppermost of FIG. 3 and the two current sources shown around the lowermost of FIG. 3, and may further comprise a set of switching units, such as those next to the adjustable current sources shown in FIG. 3, respectively. For example, the set of switching units is coupled between the set of adjustable current sources and the oscillator 110 of this embodiment, and more particularly, is coupled between the set of adjustable current sources and at least one stage (e.g. one or more stages) of the stages 310-1, 310-2, . . . , and 310-N within the oscillator 110, where the set of clock receiving terminals for obtaining the set of clock signals {CK(1), CK(2), . . . , CK(P)} can be the switching control terminals of these switching units, respectively. In addition, the clock signal ck(π+π*(0/N)) having the phase of (π+π*(0/N)), the clock signal ck(π+π*(1/N)) having the phase of (π+π*(1/N)), the clock signal ck(π*(0/N)) having the phase of (π*(0/N)), and the clock signal ck(π*(1/N)) having the phase of (π*(1/N)) that are shown in FIG. 3 can be taken as an example of the set of clock signals {CK(1), CK(2), . . . , CK(P)} shown in FIG. 1, with P=4 in this embodiment. This is for illustrative purposes only, and is not meant to be a limitation of the present invention.

According to this embodiment, the apparatus 100 may utilize the set of adjustable current sources respectively corresponding to the set of clock signals {CK(1), CK(2), . . . , CK(P)} such as the clock signal ck(π+π*(0/N)), the clock signal ck(π+π*(1/N)), the clock signal ck(π*(0/N)), and the clock signal ck(π*(1/N)), to selectively mix the set of clock signals {CK(1), CK(2), . . . , CK(P)} into the oscillator 110 according to the set of digital weighting control signals {DWC(1), DWC(2), . . . , DWC(M)}. For example, the set of digital weighting control signals {DWC(1), DWC(2), . . . , DWC(M)} of this embodiment may carry the set of digital weightings such as the digital weightings {{(1−W), W}, {(1−W), W}}, and therefore, the set of adjustable current sources respectively corresponding to the set of clock signals {CK(1), CK(2), . . . , CK(P)} such as the clock signal ck(π+π*(0/N)), the clock signal ck(π+π*(1/N)), the clock signal ck(π*(0/N)), and the clock signal ck(π*(1/N)) may generate the currents of ((1×W)*I), (W*I), ((1×W)*I), and (W*I), respectively. In addition, the set of adjustable current sources is controlled by the set of digital weighting control signals {DWC(1), DWC(2), . . . , DWC(M)}, and each adjustable current source of the set of adjustable current sources selectively mixes a corresponding clock signal of the set of clock signals {CK(1), CK(2), . . . , CK(P)}, such as the corresponding clock signal within the clock signal ck(π+π*(0/N)), the clock signal ck(π+π*(1/N)), the clock signal ck(π*(0/N)), and the clock signal ck(π*(1/N)), into the oscillator 110 according to a corresponding digital weighting control signal of the set of digital weighting control signals {DWC(1), DWC(2), . . . , DWC(M)}, such as the corresponding digital weighting control signal within the digital weighting control signals carrying the digital weightings {{(1−W), W}, {(1−W), W}}. For brevity, similar descriptions for this embodiment are not repeated in detail here.

Please note that, in the embodiment shown in FIG. 3, each stage of the plurality of stages 110-1, 110-2, . . . , and 110-N, such as any of the stages 310-1, 310-2, . . . , and 310-N shown in FIG. 3, may comprise a differential amplifier, where at least one portion (e.g. a portion or all) of the set of differential output signals S_OUT+ and S_OUT− shown in FIG. 3, such as any or both of the differential output signals S_OUT+ and S_OUT−, can be taken as an example of the output signal S_OUT shown in FIG. 1. This is for illustrative purposes only, and is not meant to be a limitation of the present invention. According to some variations of this embodiment, each stage of the plurality of stages 110-1, 110-2, . . . , and 110-N, such as any of the stages 310-1, 310-2, . . . , and 310-N shown in FIG. 3, may comprise a single-end amplifier. For brevity, similar descriptions for these variations are not repeated in detail here.

Figure 4:
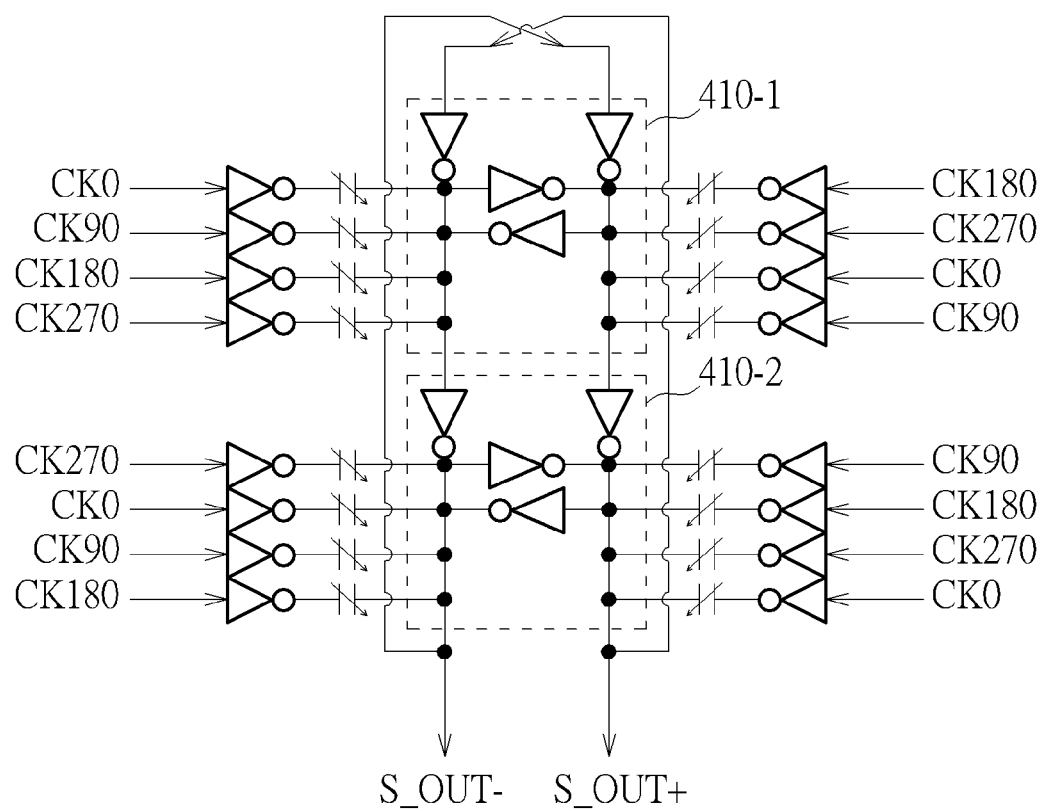
FIG. 4 illustrates a voltage mode control scheme involved with the method shown in FIG. 2 according to another embodiment of the present invention.

FIG. 4 illustrates a voltage mode control scheme involved with the method 200 shown in FIG. 2 according to another embodiment of the present invention, where the stages 410-1 and 410-2 can be taken as an example of the plurality of stages 110-1, 110-2, . . . , and 110-N shown in FIG. 1. In this embodiment, each stage of the plurality of stages 110-1, 110-2, . . . , and 110-N, such as any of the stages 410-1 and 410-2 shown in FIG. 4, may comprise a voltage mode amplifier. Based on the architecture shown in FIG. 4, the number N of the plurality of stages 110-1, 110-2, . . . , and 110-N can be equal to two in this embodiment. This is for illustrative purposes only, and is not meant to be a limitation of the present invention. According to some variations of this embodiment, the number N of the plurality of stages 110-1, 110-2, . . . , and 110-N can be greater than or equal to two. For example, the number N of the plurality of stages 110-1, 110-2, . . . , and 110-N may be an odd number. In another example, the number N of the plurality of stages 110-1, 110-2, . . . , and 110-N may be an even number.

As shown in FIG. 4, the aforementioned at least one mixing circuit such as the mixing circuit 120 may comprise a set of adjustable capacitors respectively corresponding to the set of clock signals {CK(1), CK(2), . . . , CK(P)} mentioned above, such as the eight adjustable capacitors shown around the upper half of FIG. 4, and may further comprise a set of buffers, such as those next to the eight adjustable capacitors shown around the upper half of FIG. 4, where the set of clock receiving terminals for obtaining the set of clock signals {CK(1), CK(2), . . . , CK(P)} can be the input terminals of these buffers, respectively. In addition, the aforementioned at least one mixing circuit such as the mixing circuit 120 may comprise another set of adjustable capacitors respectively corresponding to the other set of clock signals {CK(P+1), CK(P+2), . . . , CK(P+P(1))} mentioned above, such as the eight adjustable capacitors shown around the lower half of FIG. 4, and may further comprise another set of buffers, such as those next to the eight adjustable capacitors shown around the lower half of FIG. 4, where the set of clock receiving terminals for obtaining the other set of clock signals {CK(P+1), CK(P+2), . . . , CK(P+P(1))} can be the input terminals of these buffers, respectively. Additionally, the clock signal CK180 having the phase of 180°, the clock signal CK270 having the phase of 270°, the clock signal CK0 having the phase of 0°, and the clock signal CK90 having the phase of 90° that are shown around the upper right corner of FIG. 4 and the clock signal CK0 having the phase of 0°, the clock signal CK90 having the phase of 90°, the clock signal CK180 having the phase of 180°, and the clock signal CK270 having the phase of 270° that are shown around the upper left corner of FIG. 4 can be taken as an example of the set of clock signals {CK(1), CK(2), . . . , CK(P)} shown in FIG. 1, with P=8 in this embodiment. Similarly, the clock signal CK90 having the phase of 90°, the clock signal CK180 having the phase of 180°, the clock signal CK270 having the phase of 270°, and the clock signal CK0 having the phase of 0° that are shown around the lower right corner of FIG. 4 and the clock signal CK270 having the phase of 270°, the clock signal CK0 having the phase of 0°, the clock signal CK90 having the phase of 90°, and the clock signal CK180 having the phase of 180° that are shown around the lower left corner of FIG. 4 can be taken as an example of the other set of clock signals {CK(P+1), CK(P+2), . . . , CK(P+P(1))} mentioned above, with P(1)=8 in this embodiment. As a result of the arrangement in the architecture shown in FIG. 4, the apparatus 100 may operate with two-stage injection, since two sets of clock signals (e.g. the set of clock signals {CK(1), CK(2), . . . , CK(P)} such as the clock signals {{CK180, CK270, CK0, CK90}, {CK0, CK90, CK180, CK270}} shown in the upper half of FIG. 4, and the other set of clock signals {CK(P+1), CK(P+2), . . . , CK(P+P(1))} such as the clock signals {{CK90, CK180, CK270, CK0}, {CK270, CK0, CK90, CK180}} shown in the lower half of FIG. 4) are injected into the two stages 410-1 and 410-2 shown in FIG. 4, selectively. This is for illustrative purposes only, and is not meant to be a limitation of the present invention.

According to this embodiment, the apparatus 100 may utilize the set of adjustable capacitors respectively corresponding to the set of clock signals {CK(1), CK(2), . . . , CK(P)} such as the clock signals {{CK180, CK270, CK0, CK90}, {CK0, CK90, CK180, CK270}} shown in the upper half of FIG. 4, to selectively mix the set of clock signals {CK(1), CK(2), . . . , CK(P)} into the oscillator 110 according to the set of digital weighting control signals {DWC(1), DWC(2), . . . , DWC(M)}. For example, the set of digital weighting control signals {DWC(1), DWC(2), . . . , DWC(M)} of this embodiment may carry the set of digital weightings such as the digital weightings {{W1(1), W2(1), W3(1), (1−W1(1)−W2(1)−W3(1))}, {W1(1), W2(1), W3(1), (1−W1(1)−W2(1)−W3(1))}}, and therefore, the set of adjustable capacitors respectively corresponding to the set of clock signals {CK(1), CK(2), . . . , CK(P)} such as the clock signals {{CK180, CK270, CK0, CK90}, {CK0, CK90, CK180, CK270}} may obtain charges from the buffers corresponding to the clock signals {{CK180, CK270, CK0, CK90}, {CK0, CK90, CK180, CK270}} according to the digital weightings {{W1(1), W2(1), W3(1), (1−W1(1)−W2(1)−W3(1))}, {W1(1), W2(1), W3(1), (1−W1(1)−W2(1)−W3(1))}}, respectively. Thus, the set of adjustable capacitors is controlled by the set of digital weighting control signals {DWC(1), DWC(2), . . . , DWC(M)} carrying the set of digital weightings such as the digital weightings {{W1(1), W2(1), W3(1), (1−W1(1)−W2(1)−W3(1))}, {W1(1), W2(1), W3(1), (1−W1(1)−W2(1)−W3(1))}}.

In addition, the apparatus 100 may utilize the other set of adjustable capacitors respectively corresponding to the other set of clock signals {CK(P+1), CK(P+2), . . . , CK(P+P(1))} such as the clock signals {{CK90, CK180, CK270, CK0}, {CK270, CK0, CK90, CK180}} shown in the lower half of FIG. 4, to selectively mix the set of clock signals {CK(P+1), CK(P+2), . . . , CK(P+P(1))} into the oscillator 110 according to the other set of digital weighting control signals {DWC(M+1), DWC(M+2), . . . , DWC(M+M(1))}. For example, the set of digital weightings carried by the other set of digital weighting control signals {DWC(M+1), DWC(M+2), . . . , DWC(M+M(1))} in this embodiment can be the digital weightings {{W1(2), W2(2), W3(2), (1−W1(2)−W2(2)−W3(2))}, {W1(2), W2(2), W3(2), (1−W1(2)−W2(2)−W3(2))}}, and therefore, the other set of adjustable capacitors respectively corresponding to the other set of clock signals {CK(P+1), CK(P+2), . . . , CK(P+P(1))} such as the clock signals {{CK90, CK180, CK270, CK0}, {CK270, CK0, CK90, CK180}} may obtain charges from the buffers corresponding to the clock signals {{CK90, CK180, CK270, CK0}, {CK270, CK0, CK90, CK180}} according to the digital weightings {{W1(2), W2(2), W3(2), (1−W1(2)−W2(2)−W3(2))}, {W1(2), W2(2), W3(2), (1−W1(2)−W2(2)−W3(2))}}, respectively. Thus, the other set of adjustable capacitors is controlled by the other set of digital weighting control signals {DWC(M+1), DWC(M+2), . . . , DWC(M+M(1))} carrying the set of digital weightings such as the digital weightings {{W1(2), W2(2), W3(2), (1−W1(2)−W2(2)−W3(2))}, {W1(2), W2(2), W3(2), (1−W1(2)−W2(2)−W3(2))}}. For brevity, similar descriptions for this embodiment are not repeated in detail here.

Please note that, in the embodiment shown in FIG. 4, each stage of the plurality of stages 110-1, 110-2, . . . , and 110-N, such as any of the stages 410-1 and 410-2 shown in FIG. 4, may comprise a differential amplifier, where at least one portion (e.g. a portion or all) of the set of differential output signals S_OUT+ and S_OUT− shown in FIG. 4, such as any or both of the differential output signals S_OUT+ and S_OUT−, can be taken as an example of the output signal S_OUT shown in FIG. 1. This is for illustrative purposes only, and is not meant to be a limitation of the present invention. According to some variations of this embodiment, each stage of the plurality of stages 110-1, 110-2, . . . , and 110-N, such as any of the stages 410-1 and 410-2 shown in FIG. 4, may comprise a single-end amplifier. For brevity, similar descriptions for these variations are not repeated in detail here.

Figure 5:
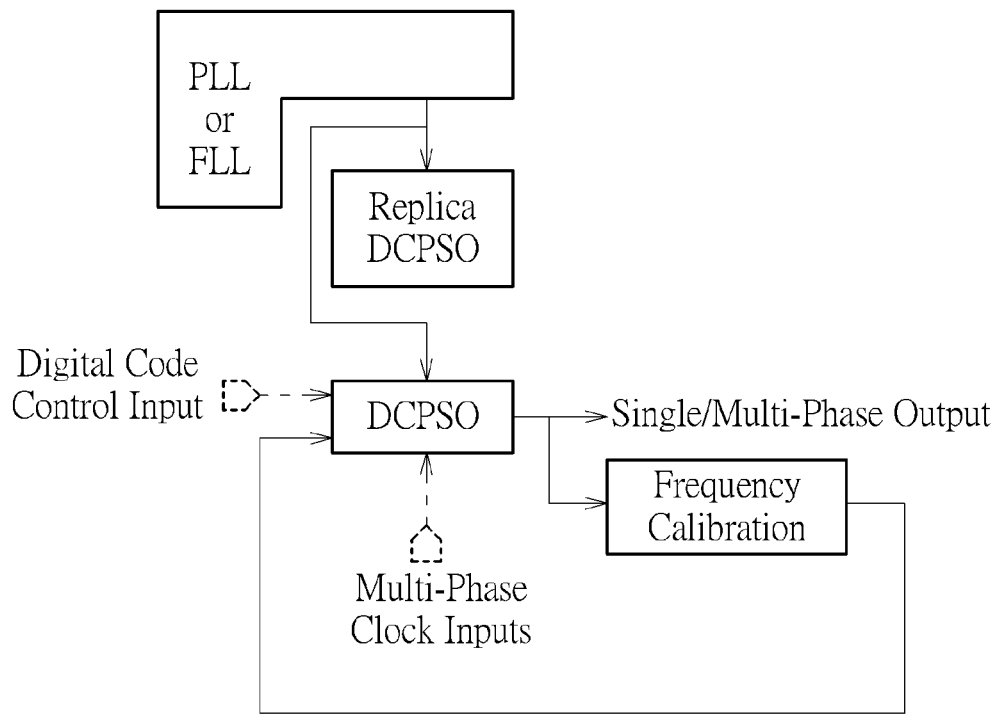
FIG. 5 illustrates a foreground calibration control scheme involved with the method shown in FIG. 2, for a foreground calibration mode of the apparatus shown in FIG. 1, according to an embodiment of the present invention.
Figure 6:
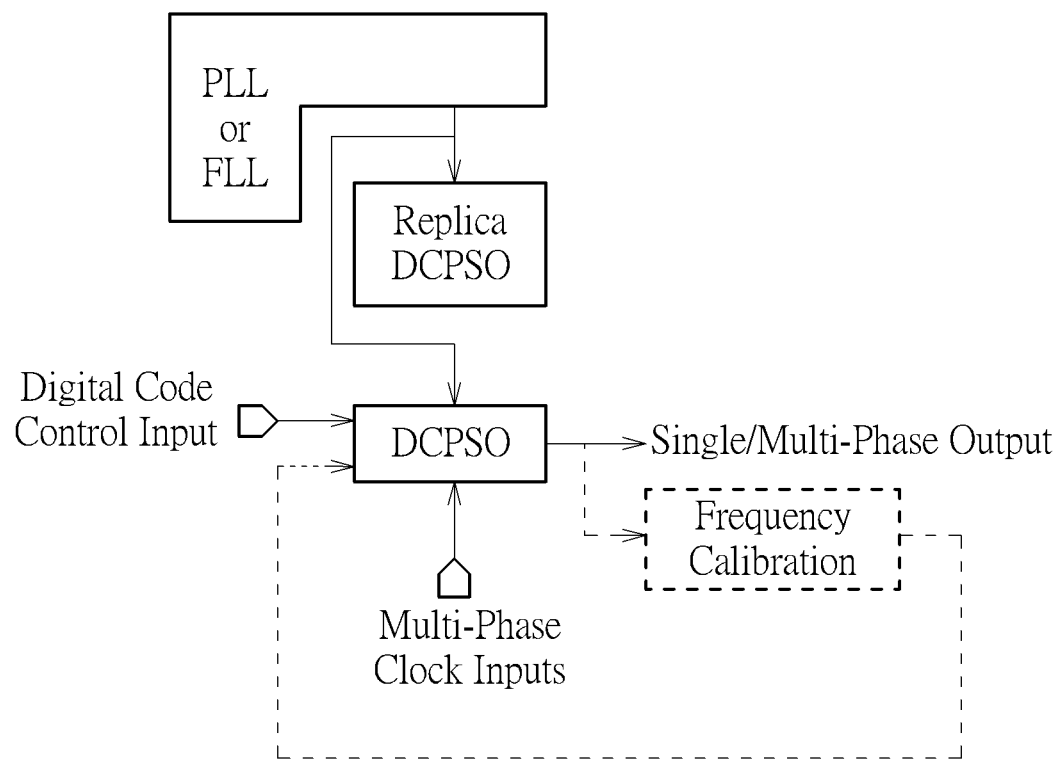
FIG. 6 illustrates a background tracking control scheme involved with the method shown in FIG. 2, for a background tracking mode of the apparatus shown in FIG. 1, according to the embodiment shown in FIG. 5.

Please refer to FIG. 5 and FIG. 6. FIG. 5 illustrates a foreground calibration control scheme involved with the method 200 shown in FIG. 2, for a foreground calibration mode of the apparatus 100 shown in FIG. 1, according to an embodiment of the present invention, and FIG. 6 illustrates a background tracking control scheme involved with the method 200 shown in FIG. 2, for a background tracking mode of the apparatus 100 shown in FIG. 1, according to the embodiment shown in FIG. 5. The digital control phase shift oscillator (DCPSO) module (labeled "DCPSO" in any of FIG. 5 and FIG. 6, for brevity) may represent the apparatus 100 shown in FIG. 1, and may operate according to the method 200 shown in FIG. 2, where the replica DCPSO module (labeled "Replica DCPSO" in any of FIG. 5 and FIG. 6, for brevity) can be a copy of the DCPSO module. For example, each of the DCPSO module and the replica DCPSO module can be implemented according to the architecture shown in FIG. 3. In another example, each of the DCPSO module and the replica DCPSO module can be implemented according to the architecture shown in FIG. 4. In this embodiment, the frequency calibration module (labeled "Frequency Calibration" in FIG. 5, for brevity) can be taken as an example of the frequency calibration module mentioned above. In addition, the DCPSO module and the replica DCPSO module can be coupled to a phase locked loop (PLL) or a frequency locked loop (FLL).

According to this embodiment, the single/multi-phase output of the DCPSO module may comprise at least one output (e.g. one or more outputs). For example, in a situation where the single/multi-phase output of the DCPSO comprises a single output, the single output can be equivalent to the output signal S_OUT. In another example, in a situation where the single/multi-phase output of the DCPSO comprises a plurality of outputs, the plurality of outputs may comprise the output signal S_OUT (e.g. the output of the last stage 110-N of the oscillator 110), and may further comprise one or more phased-shifted versions of the output signal S_OUT (e.g. the outputs of one or more stages of the other stages within the plurality of stages 110-1, 110-2, ..., and 110-N of the oscillator 110).

In this embodiment, the digital code control input of the DCPSO module may comprise at least one set of digital weighting control signals (e.g. one or more sets of digital weighting control signals). For example, in a situation where the digital code control input of the DCPSO module comprises a single set of digital weighting control signals, the single set of digital weighting control signals can be equivalent to the set of digital weighting control signals {DWC(1), DWC(2), ..., DWC(M)} mentioned above. In another example, in a situation where the digital code control input of the DCPSO module comprises a plurality of sets of digital weighting control signals, the plurality of sets of digital weighting control signals may comprise the set of digital weighting control signals {DWC(1), DWC(2), ..., DWC(M)} for the associated mixing control corresponding to one of the plurality of stages 110-1, 110-2, ..., and 110-N, and may comprise one or more other sets of digital weighting control signals (e.g. the other set of digital weighting control signals {DWC(M+1), DWC(M+2), ..., DWC(M+M(1))}, etc.) for the associated mixing control corresponding to one or more other stages within the plurality of stages 110-1, 110-2, ..., and 110-N.

Please note that the multi-phase clock inputs of the DCPSO module may comprise at least one set of clock signals (e.g. one or more sets of clock signals). For example, in a situation where the multi-phase clock inputs of the DCPSO module comprises a single set of clock signals, the single set of clock signals can be equivalent to the set of clock signals {CK(1), CK(2), ..., CK(P)}. In another example, in a situation where the multi-phase clock inputs of the DCPSO module comprises a plurality of sets of clock signals, the plurality of sets of clock signals may comprise the set of clock signals {CK(1), CK(2), ..., CK(P)} to be selectively mixed into one of the plurality of stages 110-1, 110-2, ..., and 110-N, and may comprise one or more other sets of clock signals (e.g. the other set of clock signals {CK(P+, CK(P+2), ..., CK(P+P(1))}, etc.) to be selectively mixed into one or more other stages within the plurality of stages 110-1, 110-2, ..., and 110-N.

In practice, in a situation where the DCPSO module operates in the foreground calibration mode (e.g. the foreground calibration can be applied to the apparatus 100), the paths illustrated with dashed lines shown in FIG. 5 can be temporarily disabled. Therefore, the frequency calibration module may calibrate the DCPSO module by adjusting configurations of the DCPSO module, and may monitor the operation frequency of the oscillator 110 to control the slew rate of the electronic device. In addition, in a situation where the DCPSO module operates in the background tracking mode (e.g. the apparatus 100 may perform the background tracking for the PLL or the FLL), the paths illustrated with dashed lines shown in FIG. 6 can be temporarily disabled. As a result, the DCPSO module can provide precise phase control in a wide frequency range without introducing any side effects. For brevity, similar descriptions for this embodiment are not repeated in detail here.

Figure 7:
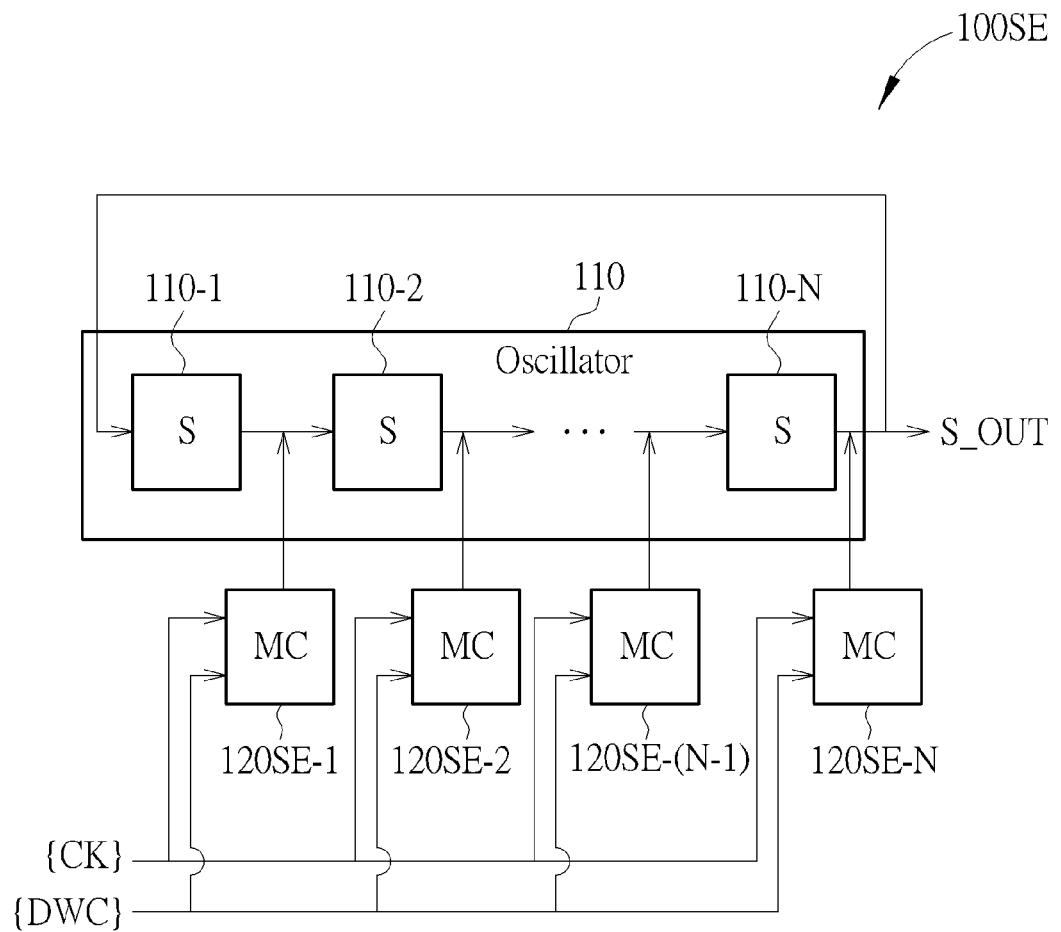
FIG. 7 illustrates a single-end control scheme involved with the method shown in FIG. 2 according to an embodiment of the present invention, where the architecture shown in FIG. 7 is equipped with multiple mixing circuits.

FIG. 7 illustrates a single-end control scheme involved with the method 200 shown in FIG. 2 according to an embodiment of the present invention, where the architecture shown in FIG. 7 can be equipped with multiple mixing circuits such as a plurality of mixing circuits 120SE-1, 120SE-2, ..., 120SE-(N−1), and 120SE-N (respectively labeled a"MC", for brevity). The plurality of mixing circuits 120SE-1, 120SE-2, ..., 120SE-(N−1), and 120SE-N of this embodiment can be taken as an example of the aforementioned one or more mixing circuits, which can be collectively referred to as the mixing circuit 120 mentioned above. In this embodiment, the set of clock signals {CK(1), CK(2), ..., CK(P)} mentioned above can be referred to as the clock signals {CK}, and the set of digital weighting control signals {DWC(1), DWC(2), ..., DWC(M)} mentioned above can be referred to as the digital weighting control signals {DWC}. In addition, the implementation of any mixing circuit of the plurality of mixing circuits 120SE-1, 120SE-2, ..., 120SE-(N−1), and 120SE-N, such as a specific mixing circuit 120SE-n of the plurality of mixing circuits 120SE-1, 120SE-2, ..., 1205E-(N−1), and 120SE-N (e.g. the index n can be a positive integer that falls within the range of the interval [1, N]), can be based on that of the mixing circuit 120 mentioned in one of the embodiment shown in FIG. 3 and the embodiment shown in FIG. 4.

In a situation where the implementation of the specific mixing circuit 120SE-n is based on that of the mixing circuit 120 mentioned in the embodiment shown in FIG. 3, the specific mixing circuit 120SE-n may comprise a set of adjustable current sources respectively corresponding to the set of clock signals {CK(1), CK(2), ..., CK(P)} mentioned above, such as the two current sources shown around the uppermost of FIG. 3, and may further comprise a set of switching units, such as those next to the two adjustable current sources shown around the uppermost of FIG. 3, respectively. For example, the set of switching units is coupled between the set of adjustable current sources and the oscillator 110 of this embodiment, and more particularly, is coupled between the set of adjustable current sources and the corresponding stage 110-n within the oscillator 110, where the set of clock receiving terminals for obtaining the set of clock signals {CK(1), CK(2), ..., CK(P)} can be the switching control terminals of these switching units, respectively. In addition, the clock signal ck(π+π*(0/N)) having the phase of (π+π*(0/N)) and the clock signal ck(π+π*(1/N)) having the phase of (π+π*(1/N)) that are shown in FIG. 3 can be taken as an example of the set of clock signals {CK(1), CK(2), ..., CK(P)} for the corresponding stage 110-n of this embodiment. This is for illustrative purposes only, and is not meant to be a limitation of the present invention.

In a situation where the implementation of the specific mixing circuit 120SE-n is based on that of the mixing circuit 120 mentioned in the embodiment shown in FIG. 4, the specific mixing circuit 120SE-n may comprise a set of adjustable capacitors respectively corresponding to the set of clock signals {CK(1), CK(2), ..., CK(P)} mentioned above, such as the four adjustable capacitors shown around the upper right of FIG. 4, and may further comprise a set of buffers, such as those next to the four adjustable capacitors shown around the upper right of FIG. 4, where the set of clock receiving terminals for obtaining the set of clock signals {CK(1), CK(2), ..., CK(P)} can be the input terminals of these buffers, respectively. In addition, the clock signal CK180 having the phase of 180°, the clock signal CK270 having the phase of 270°, the clock signal CK0 having the phase of 0°, and the clock signal CK90 having the phase of 90° that are shown around the upper right corner of FIG. 4 can be taken as an example of the set of clock signals {CK(1), CK(2), . . . , CK(P)} for the corresponding stage 110-n of this embodiment. This is for illustrative purposes only, and is not meant to be a limitation of the present invention.

No matter whether the implementation of the specific mixing circuit 120SE-n is based on that of the mixing circuit 120 mentioned in the embodiment shown in FIG. 3 or the embodiment shown in FIG. 4, the apparatus 100SE shown in FIG. 7 may control the selectively mixing operation (more particularly, the signal injection) of the specific mixing circuit 120SE-n according to the set of digital weighting control signals {DWC(1), DWC(2), . . . , DWC(M)} with the corresponding current/voltage mode control scheme (e.g. the current mode control scheme shown in FIG. 3 or the voltage mode control scheme shown in FIG. 4, depending on which mode of the current mode and the voltage mode is applied to the apparatus 100SE shown in FIG. 7). As a result of the arrangement in the architecture shown in FIG. 7, the apparatus 100SE may operate with N-stage injection. For brevity, similar descriptions for this embodiment are not repeated in detail here.

Figure 8:
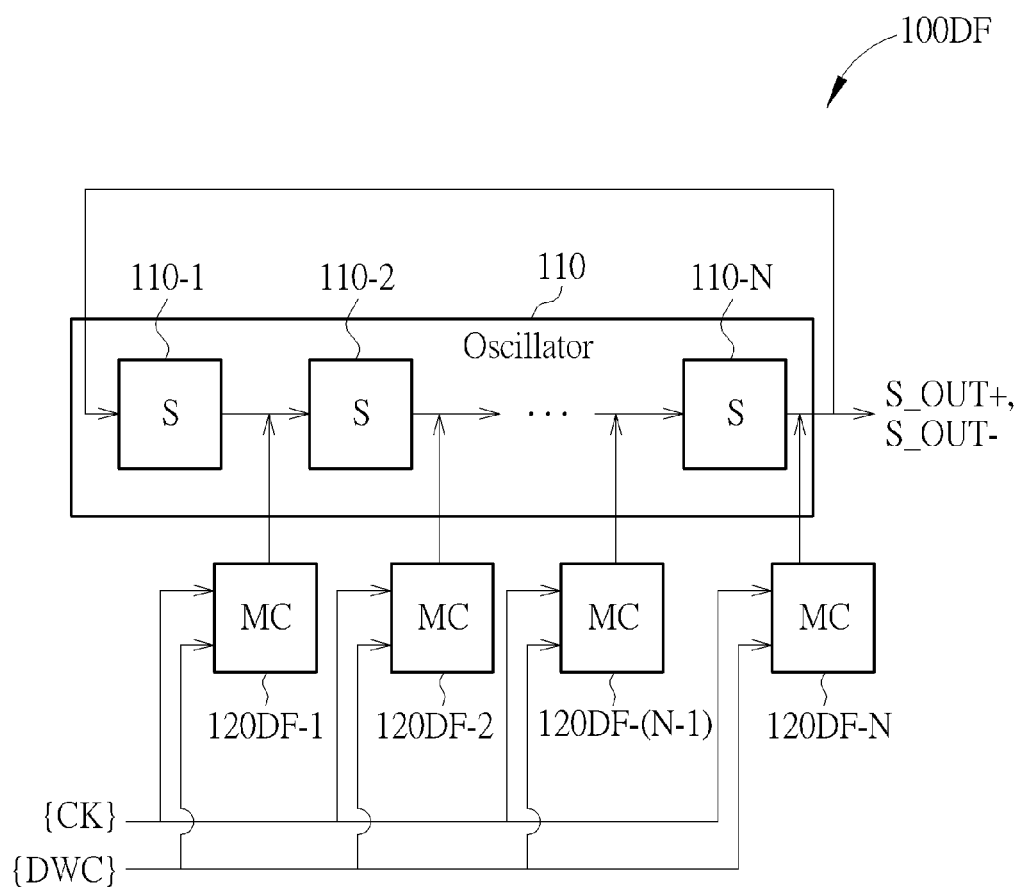
FIG. 8 illustrates a differential control scheme involved with the method shown in FIG. 2 according to another embodiment of the present invention, where the architecture shown in FIG. 8 is equipped with multiple mixing circuits.

FIG. 8 illustrates a differential control scheme involved with the method 200 shown in FIG. 2 according to another embodiment of the present invention, where the architecture shown in FIG. 8 can be equipped with multiple mixing circuits such as a plurality of mixing circuits 120DF-1, 120DF-2, . . . , 120DF-(N−1), and 120DF-N (respectively labeled "MC", for brevity). The plurality of mixing circuits 120DF-1, 120DF-2, . . . , 120DF-(N−1), and 120DF-N of this embodiment can be taken as an example of the aforementioned one or more mixing circuits, which can be collectively referred to as the mixing circuit 120 mentioned above. In this embodiment, the set of clock signals {CK(1), CK(2), . . . , CK(P)} mentioned above can be referred to as the clock signals {CK}, and the set of digital weighting control signals {DWC(1), DWC(2), . . . , DWC(M)} mentioned above can be referred to as the digital weighting control signals {DWC}. In addition, the implementation of any mixing circuit of the plurality of mixing circuits 120DF-1, 120DF-2, . . . , 120DF-(N−1), and 120DF-N, such as a specific mixing circuit 120DF-n of the plurality of mixing circuits 120DF-1, 120DF-2, . . . , 120DF-(N−1), and 120DF-N (e.g. the index n can be a positive integer that falls within the range of the interval [1, N]), can be based on that of the mixing circuit 120 mentioned in one of the embodiment shown in FIG. 3 and the embodiment shown in FIG. 4.

In a situation where the implementation of the specific mixing circuit 120DF-n is based on that of the mixing circuit 120 mentioned in the embodiment shown in FIG. 3, the specific mixing circuit 120DF-n may comprise a set of adjustable current sources respectively corresponding to the set of clock signals {CK(1), CK(2), . . . , CK(P)} mentioned above, such as the two current sources shown around the uppermost of FIG. 3 and the two current sources shown around the lowermost of FIG. 3, and may further comprise a set of switching units, such as those next to the adjustable current sources shown in FIG. 3, respectively. For example, the set of switching units is coupled between the set of adjustable current sources and the oscillator 110 of this embodiment, and more particularly, is coupled between the set of adjustable current sources and the corresponding stage 110-n within the oscillator 110, where the set of clock receiving terminals for obtaining the set of clock signals {CK(1), CK(2), . . . , CK(P)} can be the switching control terminals of these switching units, respectively. In addition, the clock signal ck($\pi+\pi^*$(0/N)) having the phase of ($\pi+\pi^*$(0/N)), the clock signal ck($\pi+\pi^*$(1/N)) having the phase of ($\pi+\pi^*$(1/N)), the clock signal ck($\pi^*$(0/N)) having the phase of ($\pi^*$(0/N)), and the clock signal ck($\pi^*$(1/N)) having the phase of ($\pi^*$(1/N)) that are shown in FIG. 3 can be taken as an example of the set of clock signals {CK(1), CK(2), . . . , CK(P)} for the corresponding stage 110-n of this embodiment. This is for illustrative purposes only, and is not meant to be a limitation of the present invention.

In a situation where the implementation of the specific mixing circuit 120DF-n is based on that of the mixing circuit 120 mentioned in the embodiment shown in FIG. 4, the specific mixing circuit 120DF-n may comprise a set of adjustable capacitors respectively corresponding to the set of clock signals {CK(1), CK(2), . . . , CK(P)} mentioned above, such as the eight adjustable capacitors shown around the upper half of FIG. 4, and may further comprise a set of buffers, such as those next to the eight adjustable capacitors shown around the upper half of FIG. 4, where the set of clock receiving terminals for obtaining the set of clock signals {CK(1), CK(2), . . . , CK(P)} can be the input terminals of these buffers, respectively. In addition, the clock signal CK180 having the phase of 180°, the clock signal CK270 having the phase of 270°, the clock signal CK0 having the phase of 0°, and the clock signal CK90 having the phase of 90° that are shown around the upper right corner of FIG. 4 and the clock signal CK0 having the phase of 0°, the clock signal CK90 having the phase of 90°, the clock signal CK180 having the phase of 180°, and the clock signal CK270 having the phase of 270° that are shown around the upper left corner of FIG. 4 can be taken as an example of the set of clock signals {CK(1), CK(2), . . . , CK(P)} for the corresponding stage 110-n of this embodiment. This is for illustrative purposes only, and is not meant to be a limitation of the present invention.

No matter whether the implementation of the specific mixing circuit 120DF-n is based on that of the mixing circuit 120 mentioned in the embodiment shown in FIG. 3 or the embodiment shown in FIG. 4, the apparatus 100DF shown in FIG. 8 may control the selectively mixing operation (more particularly, the signal injection) of the specific mixing circuit 120DF-n according to the set of digital weighting control signals {DWC(1), DWC(2), . . . , DWC(M)} with the corresponding current/voltage mode control scheme (e.g. the current mode control scheme shown in FIG. 3 or the voltage mode control scheme shown in FIG. 4, depending on which mode of the current mode and the voltage mode is applied to the apparatus 100DF shown in FIG. 8). As a result of the arrangement in the architecture shown in FIG. 8, the apparatus 100DF may operate with N-stage injection. For brevity, similar descriptions for this embodiment are not repeated in detail here.

Figure 9:
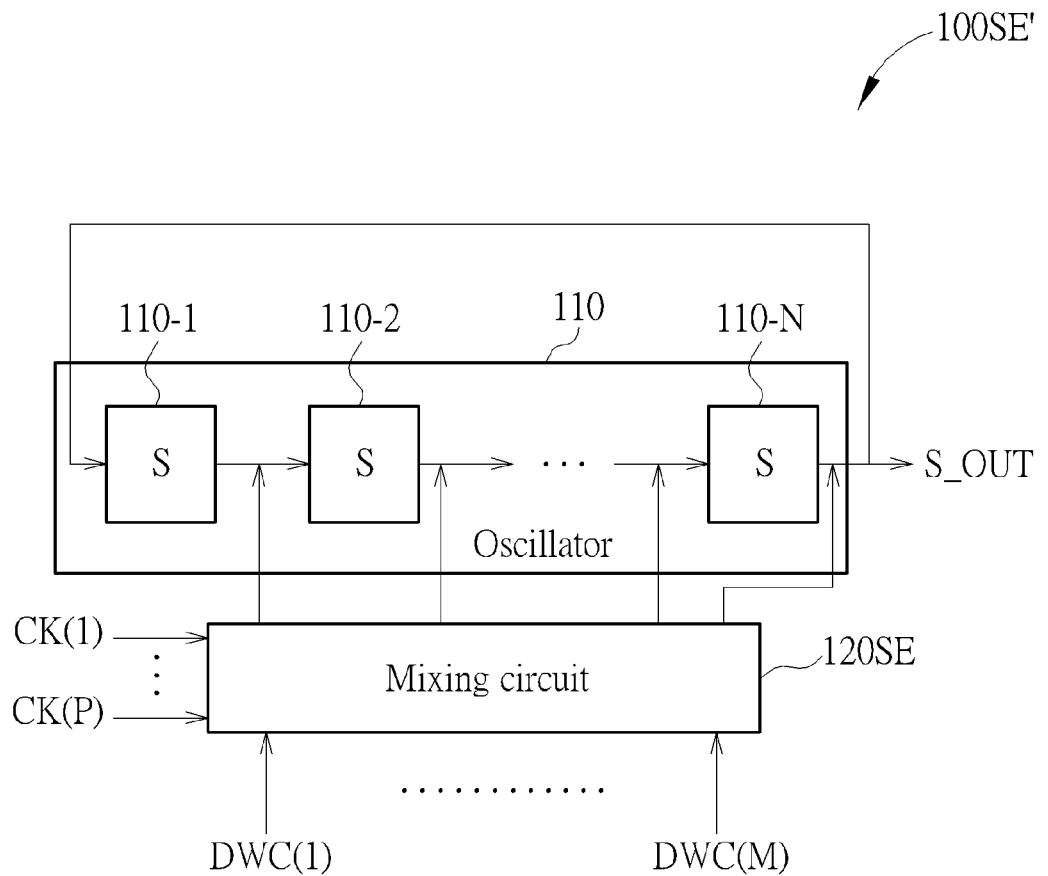
FIG. 9 illustrates a single-end control scheme involved with the method shown in FIG. 2 according to an embodiment of the present invention, where the architecture shown in FIG. 9 is equipped with a single mixing circuit.

FIG. 9 illustrates a single-end control scheme involved with the method 200 shown in FIG. 2 according to an embodiment of the present invention, where the architecture shown in FIG. 9 can be equipped with a single mixing circuit such as a mixing circuit 120SE. The mixing circuit 120SE of this embodiment can be taken as an example of the aforementioned one or more mixing circuits, which can be collectively referred to as the mixing circuit 120 mentioned above. In this embodiment, the mixing circuit 120SE can be implemented by integrating the plurality of mixing circuits 120SE-1, 120SE-2, . . . , 120SE-(N−1), and 120SE-N shown in FIG. 7 into the same module. In response to the change in the architecture, the apparatus 100SE mentioned above can be referred to as the apparatus 100SE' in this embodiment. For brevity, similar descriptions for this embodiment are not repeated in detail here.

Figure 10:
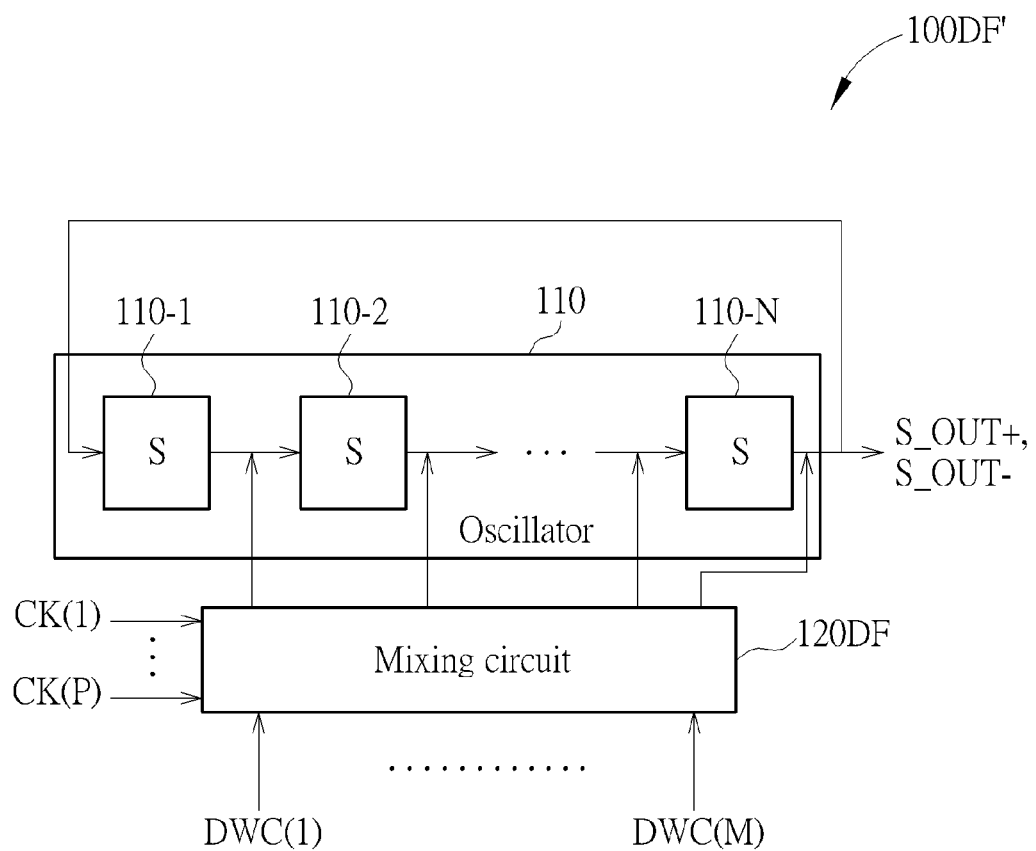
FIG. 10 illustrates a differential control scheme involved with the method shown in FIG. 2 according to another embodiment of the present invention, where the architecture shown in FIG. 10 is equipped with a single mixing circuit.

FIG. 10 illustrates a differential control scheme involved with the method 200 shown in FIG. 2 according to another embodiment of the present invention, where the architecture shown in FIG. 10 can be equipped with a single mixing circuit such as a mixing circuit 120DF. The mixing circuit 120DF of this embodiment can be taken as an example of the aforementioned one or more mixing circuits, which can be collectively referred to as the mixing circuit 120 mentioned above. In this embodiment, the mixing circuit 120DF can be implemented by integrating the plurality of mixing circuits 120DF-1, 120DF-2, . . . , 120DF-(N−1), and 120DF-N shown in FIG. 8 into the same module. In response to the change in the architecture, the apparatus 100DF mentioned above can be referred to as the apparatus 100DF' in this embodiment. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing phase shift control in an electronic device, the method comprising the steps of:
   obtaining a set of clock signals corresponding to a set of phases, wherein any two phases of the set of phases are different from each other; and
   controlling a phase shift of an output signal of an oscillator by selectively mixing the set of clock signals into the oscillator according to a set of digital weighting control signals, wherein the phase shift corresponds to the set of digital weighting control signals, and the set of digital weighting control signals carries a set of digital weightings for selectively mixing the set of clock signals.

2. The method of claim 1, wherein the oscillator comprises a plurality of stages; and the step of controlling the phase shift of the output signal of the oscillator by selectively mixing the set of clock signals into the oscillator according to the set of digital weighting control signals further comprises:
   controlling the phase shift of the output signal of the oscillator by selectively mixing the set of clock signals into a specific stage of the plurality of stages according to the set of digital weighting control signals.

3. The method of claim 2, wherein the step of controlling the phase shift of the output signal of the oscillator by selectively mixing the set of clock signals into the oscillator according to the set of digital weighting control signals further comprises:
   controlling the phase shift of the output signal of the oscillator by injecting at least one portion of the set of clock signals into the specific stage according to the set of digital weighting control signals, wherein a signal count of the at least one portion of the set of clock signals corresponds to the set of digital weightings carried by the set of digital weighting control signals.

4. The method of claim 2, further comprising:
   obtaining another set of clock signals corresponding to another set of phases, wherein any two phases of the other set of phases are different from each other;
   wherein the step of controlling the phase shift of the output signal of the oscillator by selectively mixing the set of clock signals into the oscillator according to the set of digital weighting control signals further comprises:
   controlling the phase shift of the output signal of the oscillator by selectively mixing the set of clock signals into the specific stage of the plurality of stages according to the set of digital weighting control signals and by selectively mixing the other set of clock signals into another stage of the plurality of stages according to another set of digital weighting control signals.

5. The method of claim 4, wherein the step of controlling the phase shift of the output signal of the oscillator by selectively mixing the set of clock signals into the oscillator according to the set of digital weighting control signals further comprises:
   controlling the phase shift of the output signal of the oscillator by injecting at least one portion of the set of clock signals into the specific stage of the plurality of stages according to the set of digital weighting control signals and by injecting at least one portion of the other set of clock signals into the other stage of the plurality of stages according to the other set of digital weighting control signals, wherein a signal count of the at least one portion of the set of clock signals corresponds to the set of digital weightings carried by the set of digital weighting control signals, and a signal count of the at least one portion of the other set of clock signals corresponds to a set of digital weightings carried by the other set of digital weighting control signals.

6. The method of claim 4, wherein the other set of clock signals is equivalent to the set of clock signals.

7. The method of claim 2, wherein the step of controlling the phase shift of the output signal of the oscillator by selectively mixing the set of clock signals into the oscillator according to the set of digital weighting control signals further comprises:
   controlling the phase shift of the output signal of the oscillator by injecting at least one portion of the set of clock signals into the specific stage according to the set of digital weighting control signals, rather than by locking the output signal onto any reference signal within the electronic device.

8. The method of claim 2, wherein each stage of the plurality of stages comprises a voltage mode amplifier.

9. The method of claim 8, wherein the step of controlling the phase shift of the output signal of the oscillator by selectively mixing the set of clock signals into the oscillator according to the set of digital weighting control signals further comprises:
   utilizing a set of adjustable capacitors respectively corresponding to the set of clock signals, to selectively mix the set of clock signals into the oscillator according to the set of digital weighting control signals, wherein the set of adjustable capacitors is controlled by the set of digital weighting control signals.

10. The method of claim 2, wherein each stage of the plurality of stages comprises a current mode amplifier.

11. The method of claim 10, wherein the step of controlling the phase shift of the output signal of the oscillator by selectively mixing the set of clock signals into the oscillator according to the set of digital weighting control signals further comprises:
   utilizing a set of adjustable current sources respectively corresponding to the set of clock signals, to selectively mix the set of clock signals into the oscillator according to the set of digital weighting control signals, wherein the set of adjustable current sources is controlled by the set of digital weighting control signals, and each adjustable current source of the set of adjustable current sources selectively mixes a corresponding clock signal of the set of clock signals into the oscillator according to a corresponding digital weighting control signal of the set of digital weighting control signals.

12. The method of claim 1, further comprising:
monitoring an operation frequency of the oscillator to control a slew rate of the electronic device.

13. An apparatus for performing phase shift control in an electronic device, the apparatus comprising at least one portion of the electronic device, the apparatus comprising:
an oscillator arranged to generate an output signal; and
at least one mixing circuit, electrically connected to the oscillator, arranged to perform phase shift control on the output signal of the oscillator, wherein the at least one mixing circuit comprises:
a set of clock receiving terminals arranged to obtain a set of clock signals corresponding to a set of phases, wherein any two phases of the set of phases are different from each other;
wherein the at least one mixing circuit controls a phase shift of the output signal of the oscillator by selectively mixing the set of clock signals into the oscillator according to a set of digital weighting control signals; and
the phase shift corresponds to the set of digital weighting control signals, and the set of digital weighting control signals carries a set of digital weightings for selectively mixing the set of clock signals.

14. The apparatus of claim 13, wherein the oscillator comprises a plurality of stages; and the at least one mixing circuit controls the phase shift of the output signal of the oscillator by selectively mixing the set of clock signals into a specific stage of the plurality of stages according to the set of digital weighting control signals.

15. The apparatus of claim 14, wherein the at least one mixing circuit controls the phase shift of the output signal of the oscillator by injecting at least one portion of the set of clock signals into the specific stage according to the set of digital weighting control signals, wherein a signal count of the at least one portion of the set of clock signals corresponds to the set of digital weightings carried by the set of digital weighting control signals.

16. The apparatus of claim 14, wherein the at least one mixing circuit further comprises:
another set of clock receiving terminals arranged to obtain another set of clock signals corresponding to another set of phases, wherein any two phases of the other set of phases are different from each other;
wherein the at least one mixing circuit controls the phase shift of the output signal of the oscillator by selectively mixing the set of clock signals into the specific stage of the plurality of stages according to the set of digital weighting control signals and by selectively mixing the other set of clock signals into another stage of the plurality of stages according to another set of digital weighting control signals.

17. The apparatus of claim 16, wherein the at least one mixing circuit controls the phase shift of the output signal of the oscillator by injecting at least one portion of the set of clock signals into the specific stage of the plurality of stages according to the set of digital weighting control signals and by injecting at least one portion of the other set of clock signals into the other stage of the plurality of stages according to the other set of digital weighting control signals, wherein a signal count of the at least one portion of the set of clock signals corresponds to the set of digital weightings carried by the set of digital weighting control signals, and a signal count of the at least one portion of the other set of clock signals corresponds to a set of digital weightings carried by the other set of digital weighting control signals.

18. The apparatus of claim 16, wherein the other set of clock signals is equivalent to the set of clock signals.

19. The apparatus of claim 14, wherein the at least one mixing circuit controls the phase shift of the output signal of the oscillator by injecting at least one portion of the set of clock signals into the specific stage according to the set of digital weighting control signals, rather than by locking the output signal onto any reference signal within the electronic device.

20. The apparatus of claim 14, wherein each stage of the plurality of stages comprises a differential amplifier or a single-end amplifier.

21. The apparatus of claim 13, further comprising:
a frequency calibration module arranged to monitor an operation frequency of the oscillator to control a slew rate of the electronic device.

* * * * *